US011812562B2

(12) United States Patent
Isaacs et al.

(10) Patent No.: US 11,812,562 B2
(45) Date of Patent: Nov. 7, 2023

(54) CREATING A STANDOFF FOR A LOW-PROFILE COMPONENT WITHOUT ADDING A PROCESS STEP

(71) Applicant: International Business Machines Corporation, Armonk, NY (US)

(72) Inventors: Phillip Isaacs, Rochester, MN (US); Mark J. Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 17/460,447

(22) Filed: Aug. 30, 2021

(65) Prior Publication Data

US 2023/0067845 A1   Mar. 2, 2023

(51) Int. Cl.
*B23K 35/00* (2006.01)
*H05K 3/00* (2006.01)
(Continued)

(52) U.S. Cl.
CPC ......... *H05K 3/1225* (2013.01); *B23K 3/0638* (2013.01); *B23K 35/025* (2013.01);
(Continued)

(58) Field of Classification Search
CPC .. H05K 3/1225; H05K 3/3463; H05K 3/3485; H05K 1/111; H05K 3/3436;
(Continued)

(56) References Cited

U.S. PATENT DOCUMENTS 4,431,465 A * 2/1984 Mizuhara ............. B23K 35/302
                                                        228/122.1
4,771,159 A    9/1988 O'Leary
(Continued)

FOREIGN PATENT DOCUMENTS

CN         1684573 B  *  4/2010
CN       113391716 A  *  9/2021
(Continued)

OTHER PUBLICATIONS

Kay et al., "Stencil Printing Technology for Wafer Level Bumping at Sub-100 Micron Pitch using Pb-Free Allows," Electronic Components and Technology Conference, 2005, pp. 848-854.

*Primary Examiner* — Kiley S Stoner
(74) *Attorney, Agent, or Firm* — CANTOR COLBURN LLP; Tihon Poltavets

(57) ABSTRACT

Aspects of the invention include receiving a printed circuit board (PCB) having one or more of mounting pads thereon, determining a stencil for applying a solder paste to the one or more mounting pads, the stencil having a smallest aperture for a component requiring a standoff, determining a maximum threshold size for standoff particles based on the smallest aperture, determining a first concentration of the standoff particles based on the smallest aperture, determining a minimum threshold size for standoff particles to create the standoff for the component, determining a second concentration of the standoff particles to create a three-standoff seating plane for the component, introducing the standoff particles to the solder paste, the standoff particles in the solder paste having a concentration between the first concentration and the second concentration, and a size between the maximum threshold size and the minimum threshold size.

15 Claims, 8 Drawing Sheets

(51) Int. Cl.
*H05K 3/12* (2006.01)
*H05K 3/34* (2006.01)
*B23K 3/06* (2006.01)
*B23K 35/02* (2006.01)
*H05K 1/11* (2006.01)

(52) U.S. Cl.
CPC ......... *H05K 3/3463* (2013.01); *H05K 3/3485* (2020.08); *H05K 1/111* (2013.01)

(58) Field of Classification Search
CPC ........ B23K 1/0016; B23K 2101/36–42; B23K 3/0638; B23K 35/0244–025
USPC ...................... 228/39, 41, 215, 248.1–248.5; 148/23–24
See application file for complete search history.

(56) References Cited

U.S. PATENT DOCUMENTS

| | | | |
|---|---|---|---|
| 6,059,172 A * | 5/2000 | Chapman | H01L 23/49816 228/180.22 |
| 6,360,939 B1 | 3/2002 | Paruchuri et al. | |
| 7,017,795 B2 | 3/2006 | Liu et al. | |
| 2004/0134976 A1 * | 7/2004 | Keyser | B23K 35/0244 228/248.1 |
| 2005/0077080 A1 | 4/2005 | Dairo et al. | |
| 2005/0092819 A1 * | 5/2005 | Liu | H05K 3/3485 228/248.1 |
| 2008/0293232 A1 | 11/2008 | Kang et al. | |
| 2009/0057378 A1 * | 3/2009 | Hwang | B23K 3/0623 228/248.1 |
| 2009/0080169 A1 | 3/2009 | Webster et al. | |
| 2010/0001045 A1 * | 1/2010 | Cordes | B23K 3/0623 228/208 |
| 2015/0096787 A1 * | 4/2015 | Perng | H05K 1/0213 174/250 |
| 2015/0195910 A1 * | 7/2015 | Patel | H05K 3/3436 228/104 |
| 2019/0360075 A1 | 11/2019 | Werkhoven et al. | |
| 2021/0289635 A1 * | 9/2021 | Kim | H05K 3/323 |

FOREIGN PATENT DOCUMENTS

| | | | | |
|---|---|---|---|---|
| EP | 0708582 A1 | | 4/1996 | |
| EP | 1496733 A2 * | | 1/2005 | |
| EP | 1996002 A1 * | | 11/2008 | ......... H01L 21/4853 |
| JP | H0237609 A * | | 2/1990 | |
| JP | 03047693 A * | | 2/1991 | |
| JP | H0347693 A | | 2/1991 | |
| JP | H07193159 A * | | 7/1995 | |
| JP | H10340980 A * | | 12/1998 | |
| JP | 2002314241 A * | | 10/2002 | ......... H01L 21/4853 |
| JP | 2002329745 A * | | 11/2002 | ............ H04L 24/81 |
| JP | 2004265901 A * | | 9/2004 | ................. H01B 1/22 |
| JP | 3913531 B2 * | | 5/2007 | |
| JP | WO2006123554 A1 * | | 12/2008 | |
| JP | WO2009028239 A1 * | | 11/2010 | |
| JP | 5332219 B2 * | | 11/2013 | |
| JP | 2015038927 A * | | 2/2015 | |
| TW | 1344323 B * | | 6/2011 | |
| WO | WO-2012017507 A1 * | | 2/2012 | |

* cited by examiner

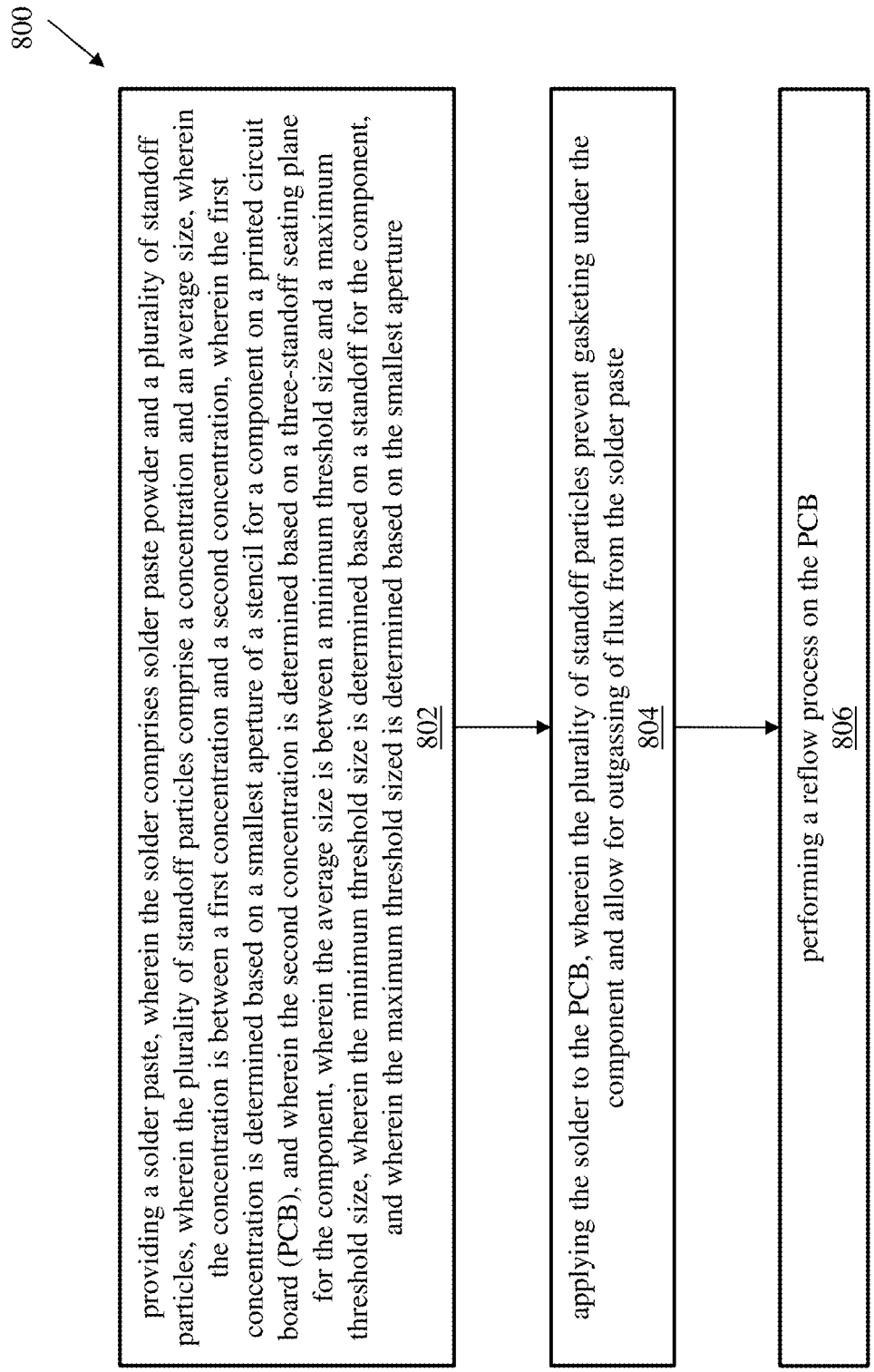

CREATING A STANDOFF FOR A LOW-PROFILE COMPONENT WITHOUT ADDING A PROCESS STEP

BACKGROUND

The present invention generally relates to printed circuit board assembly and, more specifically, to creating a standoff for a low-profile component without adding a process step.

The attachment of components to printed circuit boards (PCBs) produces printed circuit board assemblies (PCBAs), which can be used as motherboards in computers such as blades and servers, in mid-planes, as cards such as graphics cards, and for other purposes. A PCB is a laminated board made of an insulating material such as plastic which contains several layers of metal such as copper separated by insulating material. The metal may function to establish electrical connections between parts mounted on the board, to conduct heat, or to provide a ground or power.

One increasingly popular component of PCBAs is a quad flat pack no-lead (QFN) chip. QFNs can also be called MicroLead Frames (MLFs). A QFN is an electronic component encapsulated in plastic or some other insulating material. A QFN contains a row of IO pads, areas in which bare metal is exposed, on each of its four sides (hence, the "quad" in QFN) for electrical connectivity with the PCB. The QFN also typically contains a thermal pad underneath, an exposed area of metal for conducting heat away from the package. A QFN may be light, present a small footprint, and feature good thermal and electrical conductivity. The small footprint conserves space on the PCB, which can be scarce.

SUMMARY

Embodiments of the present invention are directed to methods for creating a standoff for a low-profile component. A non-limiting example of the method includes receiving a printed circuit board (PCB) having one or more of mounting pads thereon, determining a stencil for applying a solder paste to the one or more mounting pads, the stencil having a smallest aperture for a component requiring a standoff, determining a maximum threshold size for standoff particles based on the smallest aperture, determining a first concentration of the standoff particles based on the smallest aperture, determining a minimum threshold size for standoff particles to create the standoff for the component, determining a second concentration of the standoff particles to create a three-standoff seating plane for the component, introducing the standoff particles to the solder paste, the standoff particles in the solder paste having a concentration between the first concentration and the second concentration, and a size between the maximum threshold size and the minimum threshold size.

Embodiments of the present invention are directed to methods for formulating a solder paste for low-profile components. A non-limiting example of the method includes providing a solder paste, wherein the solder comprises solder paste powder and a plurality of standoff particles, wherein the plurality of standoff particles comprise a concentration and an average size, wherein the concentration is between a first concentration and a second concentration, wherein the first concentration is determined based on a smallest aperture of a stencil for a component on a printed circuit board (PCB), and wherein the second concentration is determined based on a three-standoff seating plane for the component, wherein the average size is between a minimum threshold size and a maximum threshold size, wherein the minimum threshold size is determined based on a standoff for the component, and wherein the maximum threshold sized is determined based on the smallest aperture, applying the solder to the PCB, wherein the plurality of standoff particles prevent gasketing under the component and allow for outgassing of flux from the solder paste, and performing a reflow process on the PCB.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 depicts a flow diagram of a method for formulating a solder paste for a low-profile component according to one or more embodiments of the invention.

Figure 1:
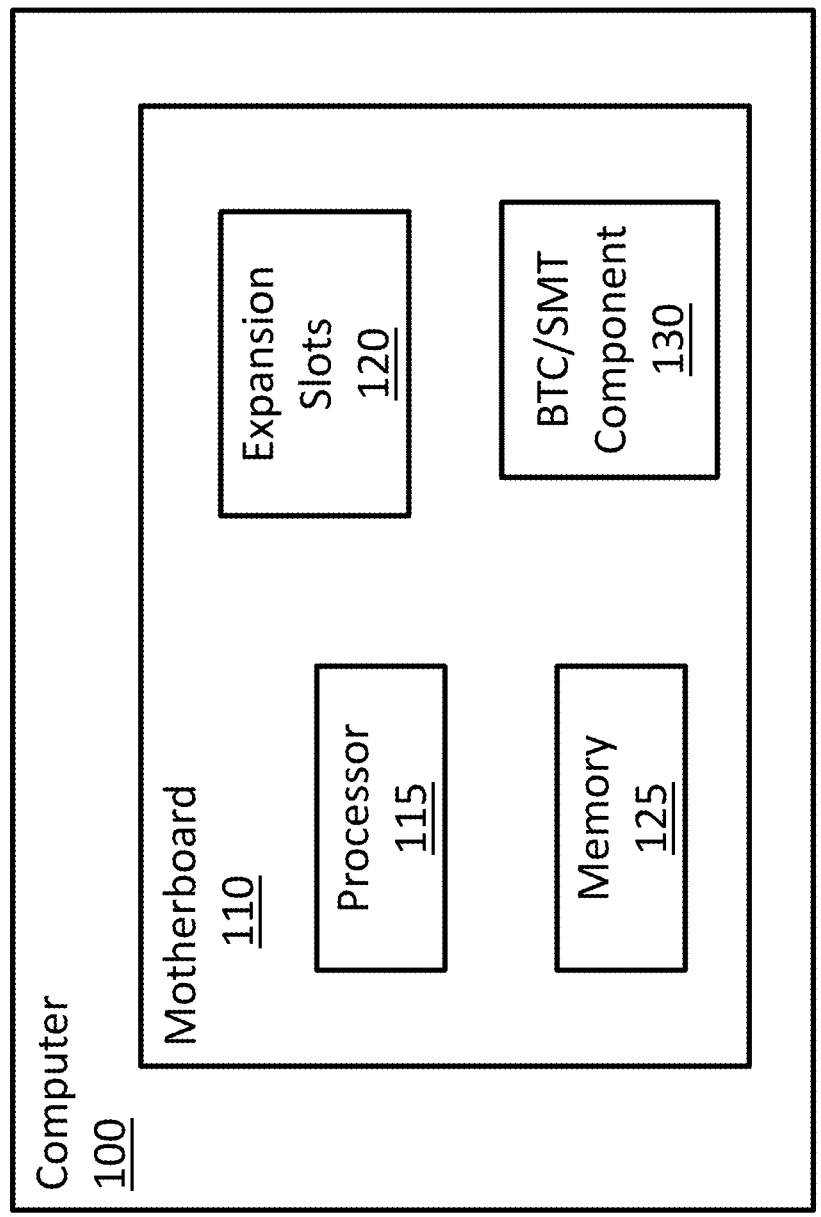
FIG. 1 depicts a computer containing a quad flat pack no-lead (QFN) attached to a printed circuit boards (PCB) according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for processes for attaching low-profile components to a printed circuit board (PCB) that allow for improved venting of volatiles from a flux during reflow. Embodiments of the invention include introducing a number of oversized particles within a solder paste formulation that will not melt or will resist melting thus preventing solder collapse. These oversized particles, also referred to herein as standoff particles, provide for venting channels between the low-profile components and the printed circuit board which allows for volatiles in the flux to dry off, evaporate, and/or burn off.

For low-profile components, the flux outgassing is challenging due to poor venting channels. This results in insufficiently solidified flux residue into a benign glassy state. When a venting channel is blocked, the solvents remain, and the flux remains viscous. The presence of solvents allows mobility of active ingredients and associated corrosion, thus posing a major threat to the reliability of the component. For no-clean fluxes, the entrapped solvents keeping the flux viscous instead of solid and glassy, allows for the mobility of activators and other ions that are still present. These ions can cause parasitic leakage, electrochemical migration and dendrites, causing failure of the system.

Flat no leads packages such as quad flat no leads (QFNs) and dual flat no leads are connected to printed circuit boards (PCB) without the need of leads. A no leads package typically includes several electrical input/output (I/O) pads surrounding a thermal pad. A flat no-leads package is affixed to a PCB by applying a solder paste to the pattern metal lands on the PCB. The package is then placed upon the solder paste. When all packages are placed on a PCB, the device is placed in a reflow oven, which heats the device until the solder melts and bonds the metal pads to the metal lands. The large thermal pad can pose some problems when soldering. During the reflow process, the assembly including the package and the PCB are first heated to a predetermined temperature that allows the solvents in the solder paste to evaporate. In addition, the flux is activated. Then the assembly is heated to a higher temperature where the solder melts. During the heating process volatile gas is produced from the solder paste and flux flows. If the gases are not properly outgassed or the flux is not permitted to flow out, voids comprising either trapped gas or flux in the solder can form.

One or more embodiments of the present invention address these venting issues by introducing oversized particles, spherical in shape for example, within the solder paste before attachment of low-profile components to a PCB. In one or more embodiments, the components attached to the PCB are referred to as low-profile components which can also include, for example, bottom terminated components (BTC) and/or surface mount technology (SMT). The oversized particles are sized to ensure no blockages in a stencil and are uniformly dispersed within the solder paste making up a concentration range of about 3% to 8% of the solder paste volume. The range can be optimized between the size of ball/standoff and the number of standoff(s) in the solder past such that a three-point seating plane is created on the pads for critical components. The concentration is selected to provide a frequency of particles on average to create a three-point seating plane for the component.

Turning now to the drawings, FIG. 1 depicts an embodiment of a computer 100 containing a motherboard 110 to which a processor 115, a memory 125, and a quad flat pack no-lead chip (QFN) 130 are attached according to embodiments of the present invention. The motherboard 110 also contains expansion slots 120. The motherboard 110 is a printed circuit board assembly (PCBA), which is a printed circuit board (PCB) to which components are attached. A PCB is a laminated board made of an insulating material such as plastic which contains several layers of metal such as copper separated by insulating material. The metal may function to establish electrical connections between parts mounted on the board, to conduct heat, or to provide a ground or power. A number of components are affixed to the motherboard 110, including a QFN 130. The QFN 130 contains a row of IO pads on each of its four sides (hence, the "quad" in QFN) for electrical connectivity with a PCB. The QFN 130 contains a thermal pad underneath, which is soldered to a thermal pad of the motherboard 110 to provide thermal conductivity and a mechanical connection and perhaps a ground or power connection. The computer 100 can represent a blade, a server, a laptop, or the like. In the embodiment of FIG. 1, a total area of the deposit of solder used to attach the thermal pad of the QFN to the motherboard 110 is determined based upon a determination of a total area for the IO pads of the QFN 130. The QFN 130 represents just one example of a low-profile component. Any type of low-profile component such as, but not limited to a quad flat package (QFP) and a ball grid array (BGA), can be utilized for this process.

Figure 2:
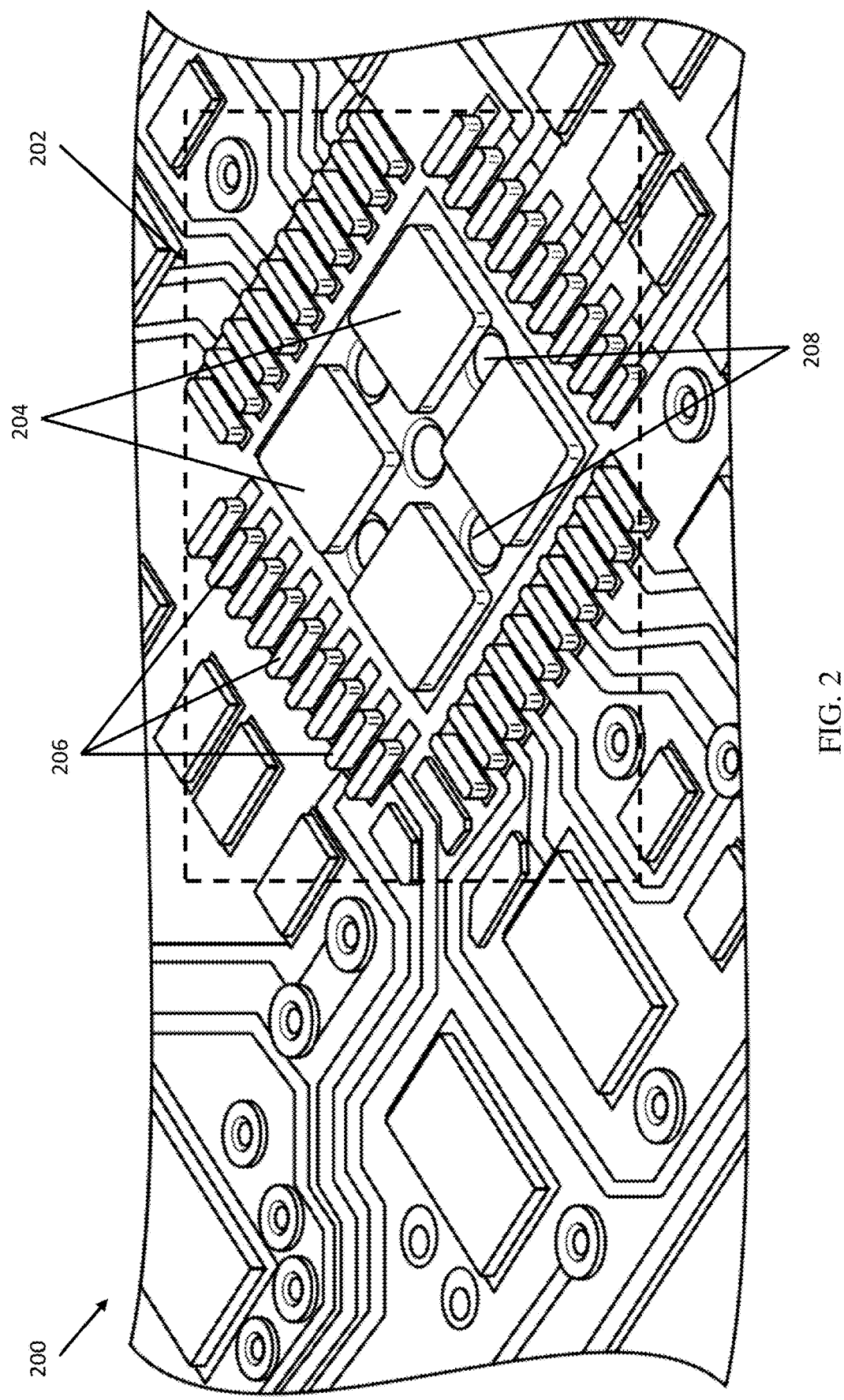
FIG. 2 depicts a perspective view of a printed circuit board according to one or more embodiments of the invention.

FIG. 2 depicts a perspective view of a PCB 200 according to one or more embodiments of the invention. The PCB 200 includes an area 202 for a QFN to be attached. This area 202 includes four thermal (mounting) pads 204 and a number of input/output (I/O) pads 206 located on all four sides (hence, "quad") of the thermal pads 204 where the QFN is to be attached. In the illustrated example, there are a total of four thermal pads 204 in the area 202 for attachment of a QFN; however, any number of solder pads can be utilized. The PCB 200 also includes vias 208 which are vertical conduits through the PCB 200 to connect the components on the PCB 200 to metal layers in the interior of the PCB 200.

As described above, and in one or more embodiments, a QFN can be attached to the thermal pads 204 and I/O pads 206 using a solder paste that includes oversized (standoff) particles mixed in with the solder paste. A solder paste, typically, includes a mixture of metal and flux with about 50% being metal and 50% being flux by volume. In some embodiments of the invention, the flux material can be a no-clean flux. The oversized particles can be introduced into the solder paste formulation and the solder paste is applied to the PCB without the need for adding a process step. As described above, low-profile components are attached to the PCB with a pattern matching the thermal pads of the package by applying solder paste to the pads. A reflow oven melts the solder allowing the components to bond with the electric contacts on the PCB. During the reflow process, the assembly comprising the package and the PCB are first heated to a predetermined temperature that allows the solvents in the solder paste to evaporate. In addition, the flux is activated. Then the assembly is heated to a higher temperature where the solder melts. During the heating process volatile gas is produced from the solder paste and flux flows. The oversized particles allow for these volatiles to vent thus reducing issues that arise from unvented volatiles in the solder and flux.

Figure 3:
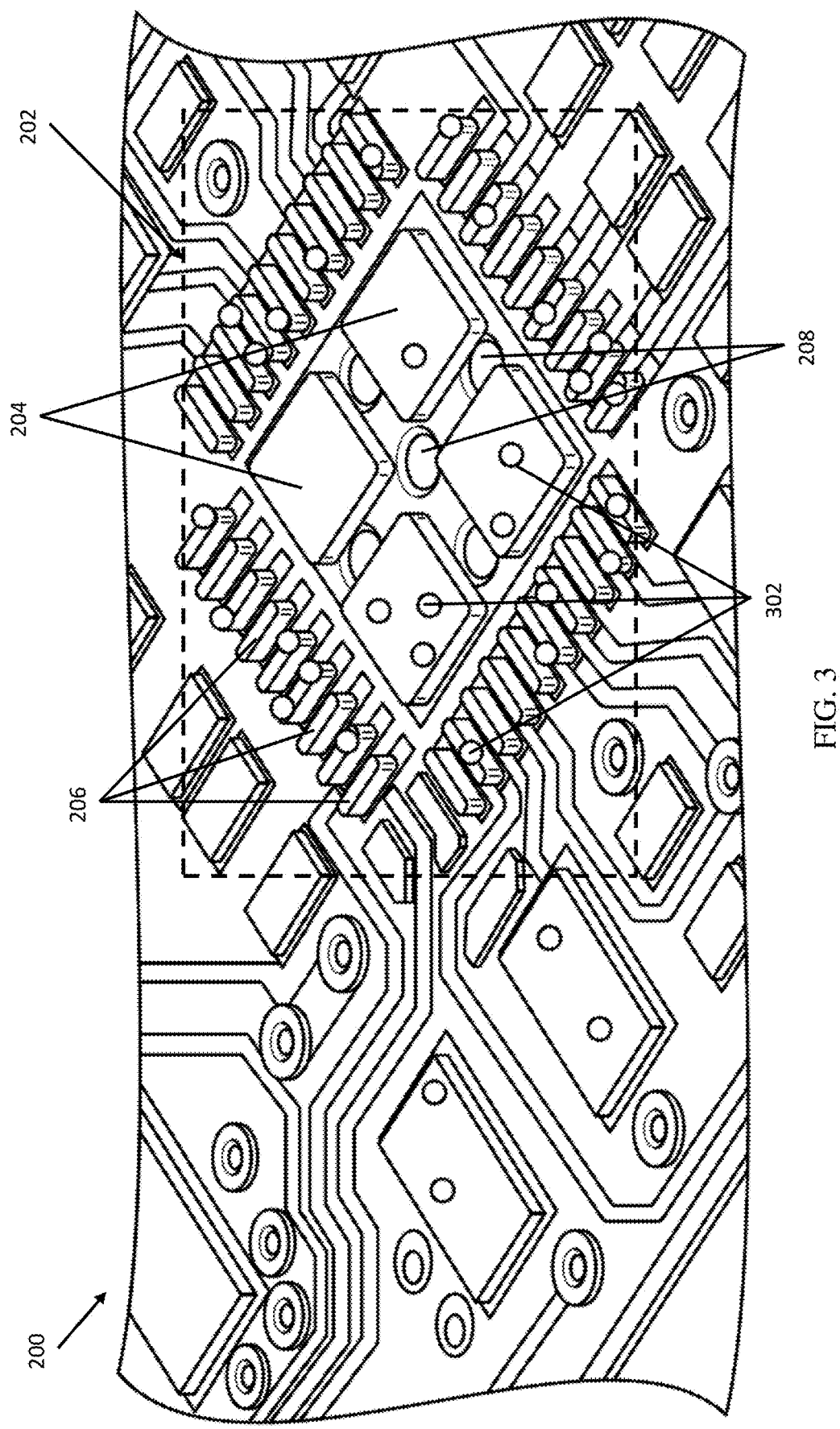
FIG. 3 depicts a perspective view of the printed circuit board according to one or more embodiments of the invention.

FIG. 3 depicts a perspective view of the printed circuit board according to one or more embodiments of the invention. The PCB 200 as shown in FIG. 2 now includes a number of oversized particles 302 on the thermal pads 204 and I/O pads 206. These oversized particles 302 are sized based on the sizing of the PCB 200 and low-profile component so that gases are properly vented from the flux. In addition, the concentration of oversized particles 302 is such that the solder paste includes at least three particles 302 for the area 202 that a low-profile component is being placed.

In one or more embodiments of the invention, the oversized particles 302 will not melt during the reflow process and can be a material including, but not limited to, copper, tin, nickel, brass, gold, and/or a flash of gold over flash plated nickel. The particles 302 can be spherical in shape and can be conductive or non-conductive. The particles 302 can be wettable. Wettability is defined as the attraction of a liquid phase to solid surface, and it is typically quantified using a contact angle with the solid phase. Wetting is the ability of a liquid to maintain contact with a solid surface resulting from intermolecular interactions when the two are brought together. The concentration of particles 302 within the solder paste can be from about 3% to about 8% by volume. The solder paste can be formulated based on the variety of factors described above. As described above, the solder paste includes, by volume, about 50% metal and 50% flux with the oversized particles 402 dispersed therein. This formulation can be manufactured using any suitable process and deployed during the manufacturing and packing of these components on a PCB 200.

In one or more embodiments of the invention, the oversized particles 302 added to the solder paste formulation do not add a process step to the PCB manufacturing process. The solder paste formulation can be application specific (e.g., based on what type of components are being mounted to the PCB). A manufacturing process can select the solder paste formulation with the appropriately sized particles based on characteristics of the components. The standoff particle size needs to be configured to meet the optimal stand off for the assembly and in reflow of the solder. A good starting point would be to create a ball that is 2 to 4 times larger than the solder paste powder. The standoff then creates a low or no impedance path for the flux volatiles to escape from the solder joint during the reflow of the solder. For example, for a QFN mounting to a PCB, a selection of the particle size and material can be made from a set of solder paste formulations and then the solder paste can be utilized during the manufacturing of the package. The solder paste formulation can be manufactured with a pre-set particle size for the standoff particles to achieve the desired effect of venting volatiles from flux without degrading the purpose of the components on the PCB.

In one or more embodiments of the invention, the solder paste can be manufactured according to the desired standoff particle size and concentration amount other desired characteristics. The particle size can be based on the component size for the PCB and the concentration can vary from a fraction of the mounting pads having standoff particles, to roughly 1 to 2 particles per mounting pad are present on the PCB. As the number of pins increase, the number of balls can be reduced per pin. A BTC will need to always have 3 or more particles distributed across its pads to create a seating plane.

In one or more embodiments of the invention, the concentration and size is to be selected on the basis of the smallest component aperture where a standoff is required, or the smallest aperture, in general, so as not to plug the apertures with too many oversized particles. The concentration of oversized particles is selected to provide a frequency of particles to always create a seating plane. In the example below, on average of one oversized particle per four stencil aperture openings can be selected for the low-profile QFN or BTC. For example, for a printed circuit board assembly there is a bottom terminated component (BTC) that requires a standoff with 32 bottom side terminations with mounting pad dimensions of 8×16 mils. In this case, it is decided to have 25 percent of the pads with oversized particles. This is sufficient to create a three-point seating plane, and more. Assume: one-to-one stencil aperture to mounting pad dimensions and a stencil thickness of 4 mils. For this case a particle size is selected with a 4-mil diameter, which is half of the width of the aperture openings. The volume of one oversized particle is $4/3\pi r^3$, or 33.5 cubic mils. The volume of solder paste printed on a mounting pad is 8 mils×16 mils×4 equals 512 cubic mils. The volume of four solder paste deposits of this device equals: 2048 cubic mils and the ratio of solder paste volume to metal volume is approximately 1:1, hence the metal volume in the solder paste of these four is 1024 cubic mils. This results in the ratio normal solder paste metal particle volume to over-sized particle volume being (1024-33.5)/33.5, which equals approximately 30 to 1, or 3.4 percent oversized particles by volume.

Figure 4:
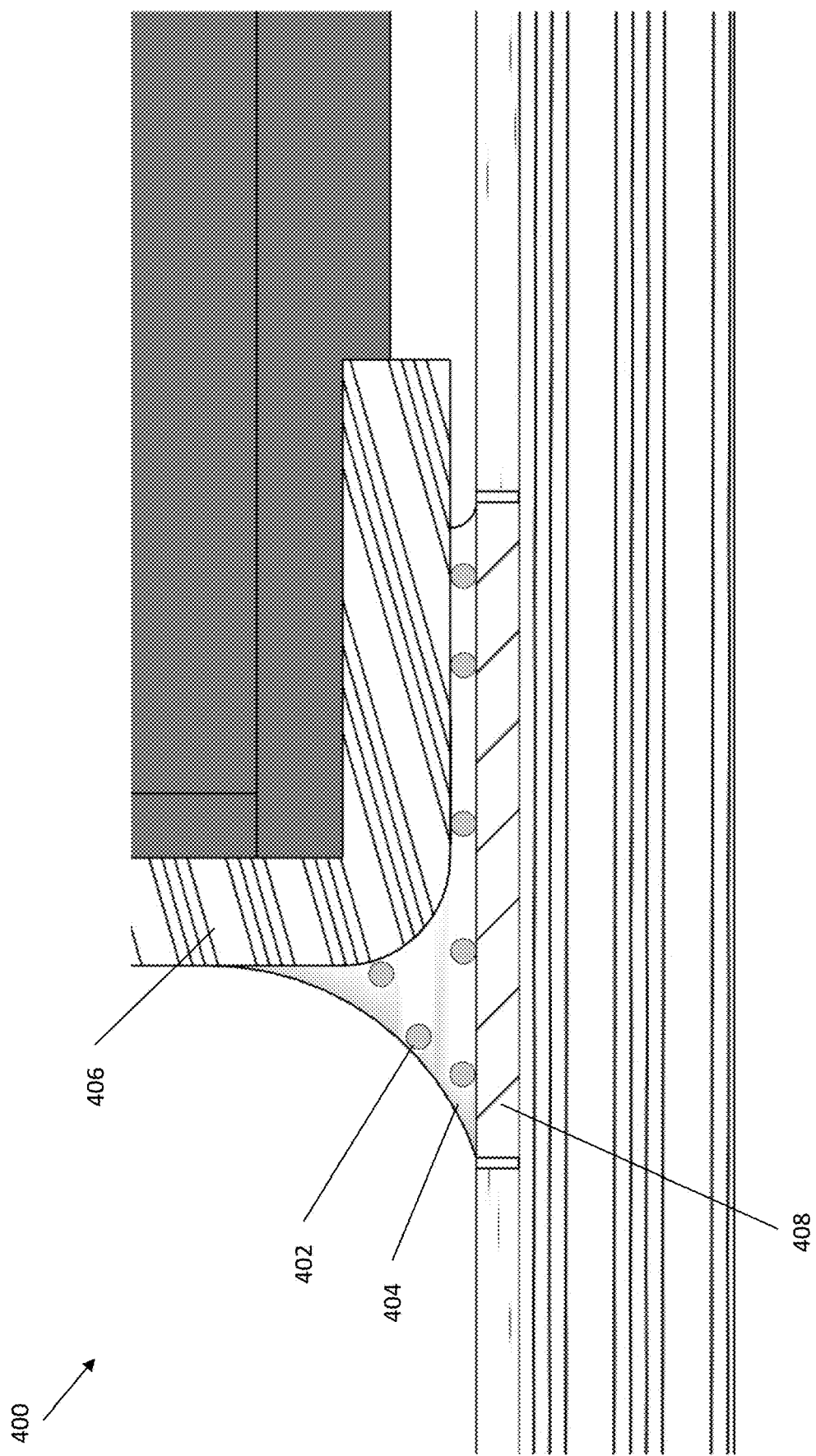
FIG. 4 depicts a side view of a portion of a printed circuit board with a component soldered to the board using standoff particles to allow venting according to one or more embodiments of the invention.

FIG. 4 depicts a side view of a portion of a printed circuit board with a component soldered to the board using standoff particles to allow venting according to one or more embodiments of the invention. The PCB 400 includes standoff particles 402 in a solder paste 404 with a copper lead 406 sitting on the solder paste 404. The copper lead 406 is part of a larger component such as, for example, a QFN. The standoff particles 402 here allows for outgassing of the volatiles in the flux to be released. The solder past 404 is applied through a stencil on a mounting pad 408 of the PCB 400.

Figure 5:
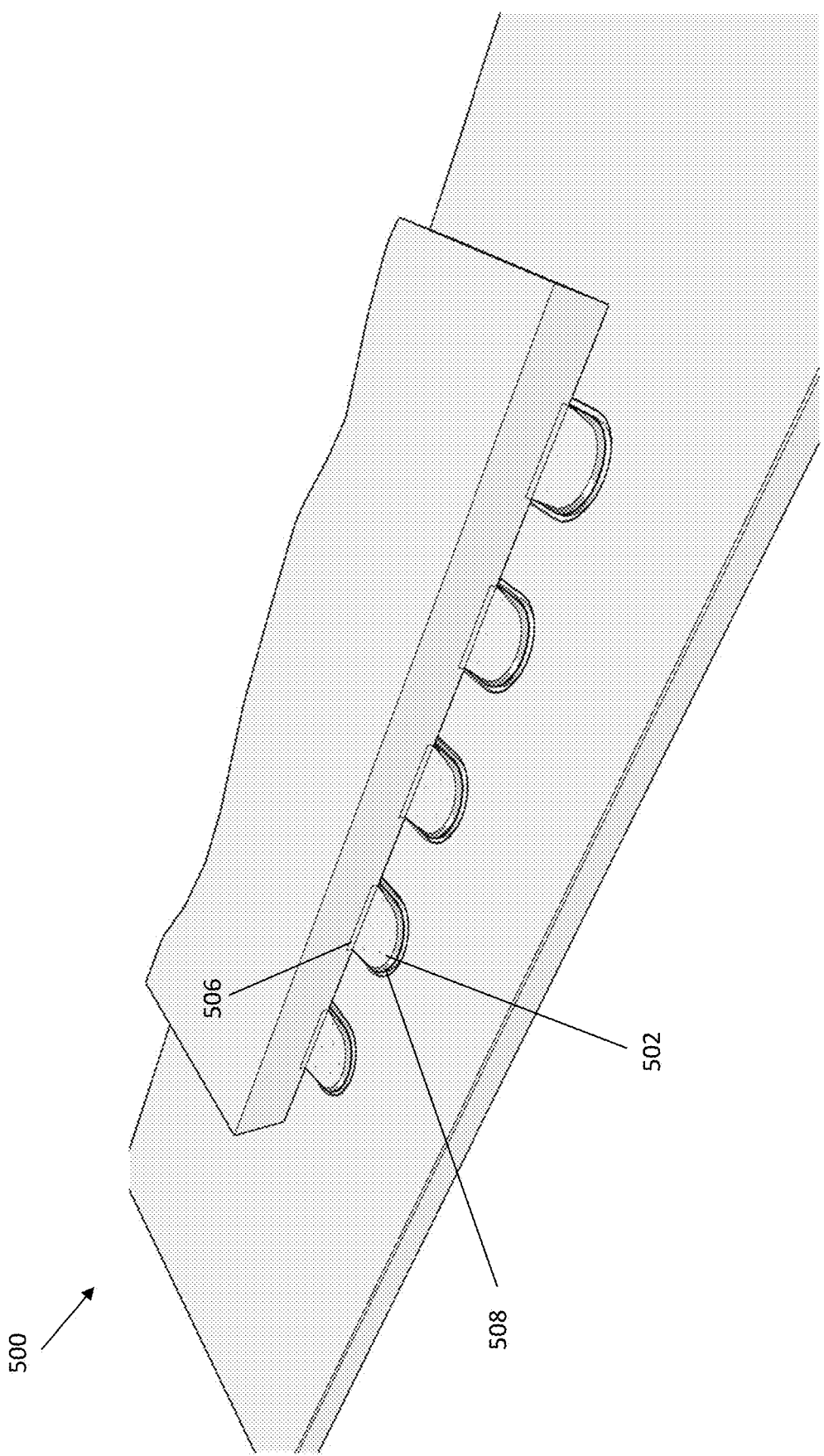
FIG. 5 depicts a perspective view of a printed circuit board with a component soldered to the board using standoff particles to allow venting according to one or more embodiments of the invention.

FIG. 5 depicts a perspective view of a printed circuit board with a component soldered to the board using standoff particles to allow venting according to one or more embodiments of the invention. The PCB 500 includes standoff particles 502 in a solder paste sitting on a mounting pad 508. The leads 506 of a low profile component are soldered to the mounting pads 508 using a soldering paste having standoff particles 502 allowing outgassing of volatiles.

Figure 6:
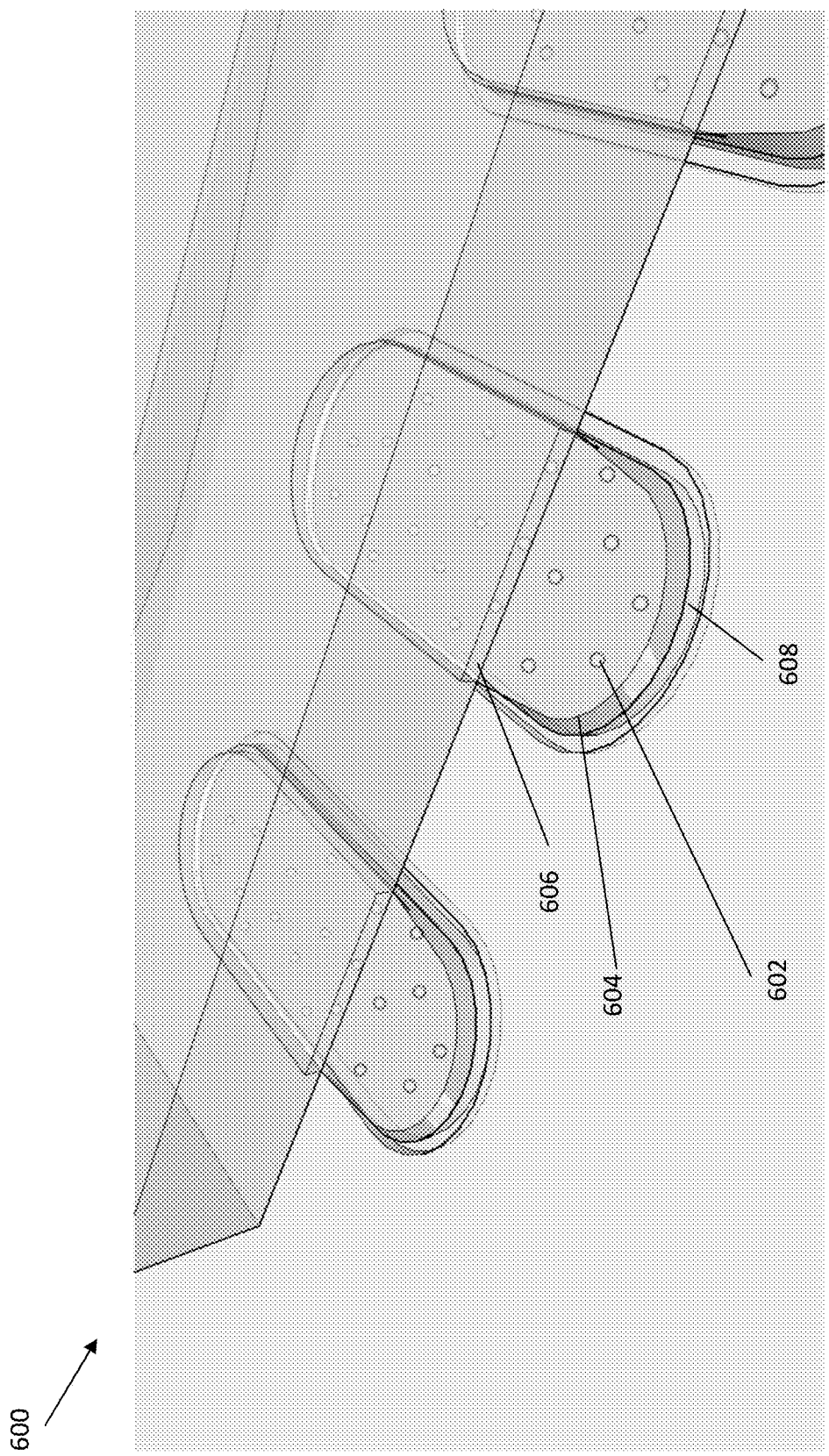
FIG. 6 depicts a perspective cutaway view of a printed circuit board with a low profile component soldered to the board using standoff particles to allow for venting according to one or more embodiments.

FIG. 6 depicts a perspective cutaway view of a printed circuit board with a low profile component soldered to the board using standoff particles to allow for venting according to one or more embodiments. The PCB 600 includes standoff particles 602 in a solder paste 604. The solder paste 604 is utilized for a low-profile component having electronic leads 606 to a mounting pad 608 on the PCB 600.

Figure 7:
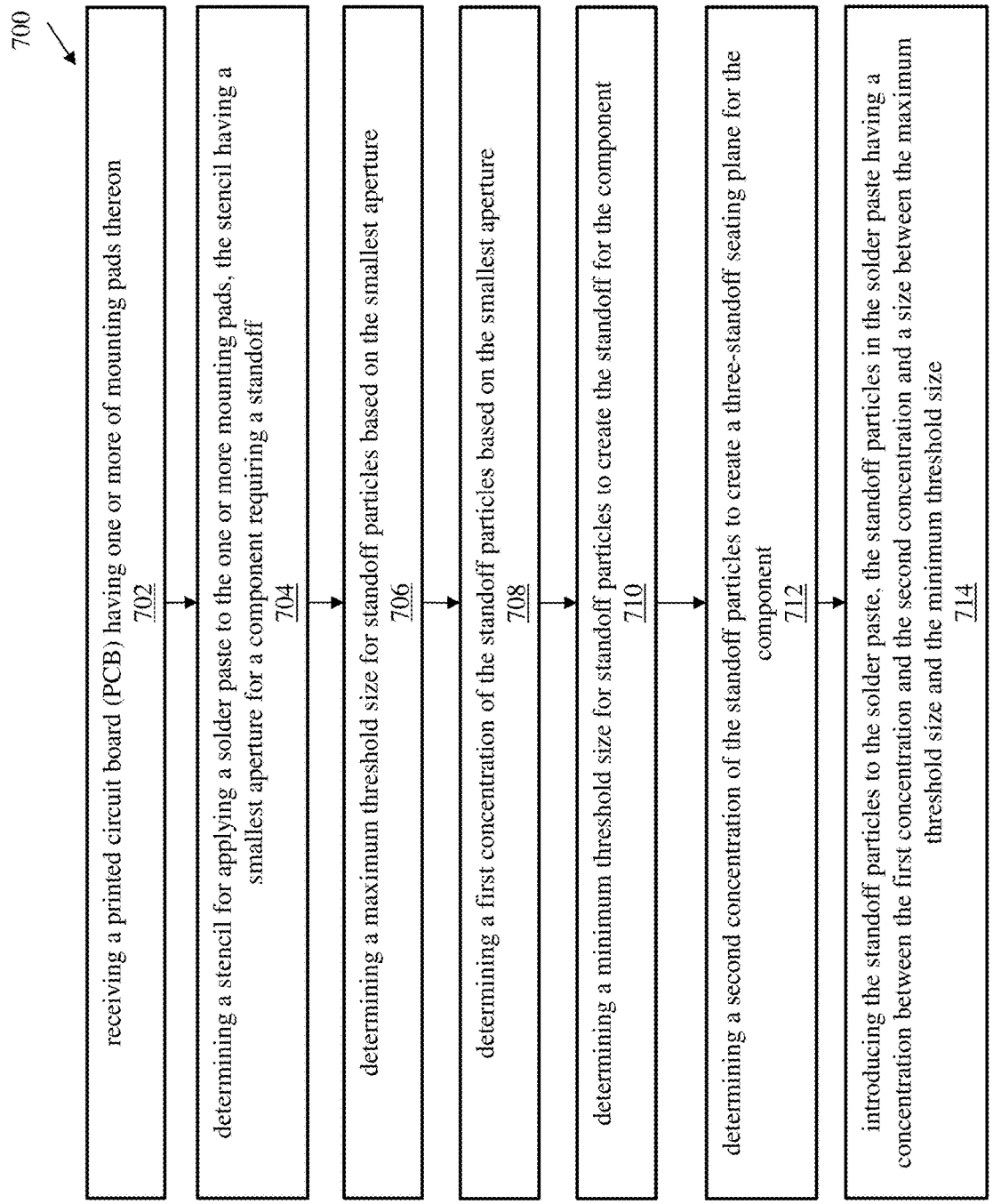
FIG. 7 depicts a flow diagram of a method for creating a standoff for a low-profile component according to one or more embodiments of the invention.

FIG. 7 depicts a flow diagram of a method for creating a standoff for a low-profile component according to one or more embodiments of the invention. The method 700 includes receiving a printed circuit board (PCB) having one or more of mounting pads thereon, as shown in block 702. Also, at block 704, the method 700 includes determining a stencil for applying a solder paste to the one or more mounting pads, the stencil having a smallest aperture for a component requiring a standoff. And at block 706, the method 700 includes determining a maximum threshold size for standoff particles based on the smallest aperture. Also, the method 700 includes determining a first concentration of the standoff particles based on the smallest aperture, as shown in block 708. At block 710, the method 700 includes determining a minimum threshold size for standoff particles to create the standoff for the component. The method 700, at block 712, includes determining a second concentration of the standoff particles to create a three-standoff seating plane for the component. And at block 714, method 700 includes introducing the standoff particles to the solder paste, the standoff particles in the solder paste having a concentration between the first concentration and the second concentration and a size between the maximum threshold size and the minimum threshold size.

Additional processes may also be included. It should be understood that the processes depicted in FIG. 7 represent illustrations, and that other processes may be added or existing processes may be removed, modified, or rearranged without departing from the scope and spirit of the present disclosure.

FIG. 8 depicts a flow diagram of a method for formulating a solder paste for a low-profile component according to one or more embodiments of the invention. The method 800 includes providing a solder paste, wherein the solder comprises solder paste powder and a plurality of standoff particles, wherein the plurality of standoff particles comprise a concentration and an average size, wherein the concentration is between a first concentration and a second concentration, wherein the first concentration is determined based on a smallest aperture of a stencil for a component on a printed circuit board (PCB), and wherein the second concentration is determined based on a three-standoff seating plane for the component, wherein the average size is between a minimum threshold size and a maximum threshold size, wherein the minimum threshold size is determined based on a standoff for the component, and wherein the maximum threshold sized is determined based on the smallest aperture, as shown in block 802. Then, the method 800 includes applying the solder to the PCB, wherein the plurality of standoff particles prevent gasketing under the component and allow for outgassing of flux from the solder paste, as shown in block 804. And at block 806, the method 800 includes performing a reflow process on the PCB.

Additional processes may also be included. It should be understood that the processes depicted in FIG. 8 represent illustrations, and that other processes may be added or existing processes may be removed, modified, or rearranged without departing from the scope and spirit of the present disclosure.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving a printed circuit board (PCB) having one or more of mounting pads thereon;
   determining a stencil for applying a solder paste to the one or more mounting pads, the stencil having a smallest aperture for a component requiring a standoff;
   determining a maximum threshold size for standoff particles based on the smallest aperture;
   determining a first concentration of the standoff particles based on the smallest aperture;
   determining a minimum threshold size for standoff particles to create the standoff for the component;
   determining a second concentration of the standoff particles to create a three-standoff seating plane for the component;
   introducing the standoff particles to the solder paste, the standoff particles in the solder paste having:
   a concentration between the first concentration and the second concentration; and
   a size between the maximum threshold size and the minimum threshold size.

2. The method of claim 1, further comprising: applying the solder paste to the PCB through the stencil.

3. The method of claim 1, wherein determining the maximum threshold size of the standoff particles based on the smallest aperture comprises:
   determining a width of the smallest aperture; and
   selecting the maximum threshold size for the oversized particles being half of the width of the smallest aperture.

4. The method of claim 1, wherein determining the minimum threshold size of the standoff particles to create the standoff for the component comprises:
   determining a particle size for the solder paste;
   selecting the minimum threshold size for the oversized particles being about 2 to about 4 times larger than the particle size for the solder paste.

5. The method of claim 1, wherein determining a first concentration of the standoff particles based on the smallest aperture comprises:
   determining a width of the smallest aperture;
   selecting the first concentration of the standoff particles that does not clog the smallest aperture of the stencil.

6. The method of claim 1, wherein determining a second concentration of the standoff particles to create a three-standoff seating plane for the component comprises:
   determining a size of a smallest mounting pad in the one or more mounting pads;
   selecting the second concentration required for a three-point seating plane of a component for the smallest mounting pad.

7. The method of claim 1, wherein the standoff particles comprise a spherical shape.

8. The method of claim 1, wherein the standoff particles comprise a non-conductive material.

9. The method of claim 1, wherein the standoff particles comprise a conductive material.

10. The method of claim 1, wherein the standoff particles comprise a wettable material.

11. A method comprising:
    providing a solder paste, wherein the solder comprises solder paste powder and a plurality of standoff particles, wherein the plurality of standoff particles comprise a concentration and an average size;

wherein the concentration is between a first concentration and a second concentration, wherein the first concentration is determined based on a smallest aperture of a stencil for a component on a printed circuit board (PCB), and wherein the second concentration is determined based on a three-standoff seating plane for the component;

wherein the average size is between a minimum threshold size and a maximum threshold size, wherein the minimum threshold size is determined based on a standoff for the component, and wherein the maximum threshold sized is determined based on the smallest aperture;

applying the solder to the PCB, wherein the plurality of standoff particles prevent gasketing under the component and allow for outgassing of flux from the solder paste; and performing a reflow process on the PCB.

12. The method of claim 11, wherein the plurality of standoff particles comprise a spherical shape.

13. The method of claim 11, wherein the plurality of standoff particles comprise a non-conductive material.

14. The method of claim 11, wherein the plurality of standoff particles comprise a conductive material.

15. The method of claim 11, wherein the plurality of standoff particles comprise a wettable material.

* * * * *